(12) United States Patent
van Dal et al.

(10) Patent No.: US 8,823,102 B2
(45) Date of Patent: Sep. 2, 2014

(54) DEVICE WITH A STRAINED FIN

(71) Applicant: Taiwan Semiconductor Manufacturing Company, Ltd., Hsin-Chu (TW)

(72) Inventors: Mark van Dal, Heverlee (BE); Gerben Doornbos, Leuven (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/678,938

(22) Filed: Nov. 16, 2012

(65) Prior Publication Data

US 2014/0138770 A1    May 22, 2014

(51) Int. Cl.
  *H01L 27/12*         (2006.01)
(52) U.S. Cl.
  USPC ........................................... 257/347
(58) Field of Classification Search
  USPC .............. 257/14, 192, 285, 20, 552–562,
    257/E29.033, 55, 615, 347, E29.089,
    257/E27.059, 66, 72, 223, 227, 291, 292,
    257/439, 443, 655, E27.1, E27.125,
    257/E27.112, E29.117, E29.145, E29.147,
    257/E29.151, E29.182, E29.202,
    257/E29.273–E29.299, E29.314, E29.32,
    257/E23.016, E21.7, E29.003, E29.295,
    257/E21.094, E21.104, E21.121, E21.372,
    257/E21.411–E21.416; 438/149
  See application file for complete search history.

(56) References Cited

U.S. PATENT DOCUMENTS

| | | | | |
|---|---|---|---|---|
| 2005/0184316 A1* | 8/2005 | Kim et al. | ...................... | 257/213 |
| 2005/0279992 A1* | 12/2005 | Gupta et al. | ..................... | 257/24 |
| 2011/0147711 A1* | 6/2011 | Pillarisetty et al. | ............. | 257/24 |
| 2011/0272739 A1* | 11/2011 | Lee et al. | ...................... | 257/192 |

OTHER PUBLICATIONS

Unpublished U.S Appl. No. 13/161,649, filed Jun. 16, 2011, entitled "Strained Channel Field Effect Transistor,"46 pages.
Unpublished U.S. Appl. No. 13/600,369, filed Aug. 31, 2012, entitled "A Fin Field Effect Transistor Layout for Stress Optimization," 32 pages.
N. Serra et al., "Experimental and Physics-Based Modeling Assessment of Strain Induced Mobility Enhancement in FinFETs", 97-4244-5640-6/09, 2009 IEEE, IEDM09-71 through IEDM09-74.
T. Ghani et al., "A 90nm High Volume Manufacturing Logic Technology Featuring Novel 45nm Gate Length Strained Silicon CMOS Transistors", 0-7803-7872-5/03, 2003 IEEE, 978-980.

* cited by examiner

*Primary Examiner* — Dao H Nguyen
*Assistant Examiner* — Tram H Nguyen
(74) *Attorney, Agent, or Firm* — Haynes and Boone, LLP

(57) ABSTRACT

A device includes a wafer substrate having at least two isolation features, a buffer layer embedded between the two isolation features and a fin disposed over the buffer layer. The buffer layer includes a first lattice constant. The fin includes at least one pair of alternating layers having a compressive strained layer and a tensile strained layer such that the pair of alternating layer has a second lattice constant matching to the first lattice constant and remains strained at edge of the fin. The device further includes a gate disposed over the fin. The buffer layer, the compressive strained layer, and the tensile strained layer include element in Group III-V, or combination thereof. A thickness of the compressive strained layer or a thickness of the tensile strained layer is a function of the first lattice constant.

20 Claims, 10 Drawing Sheets

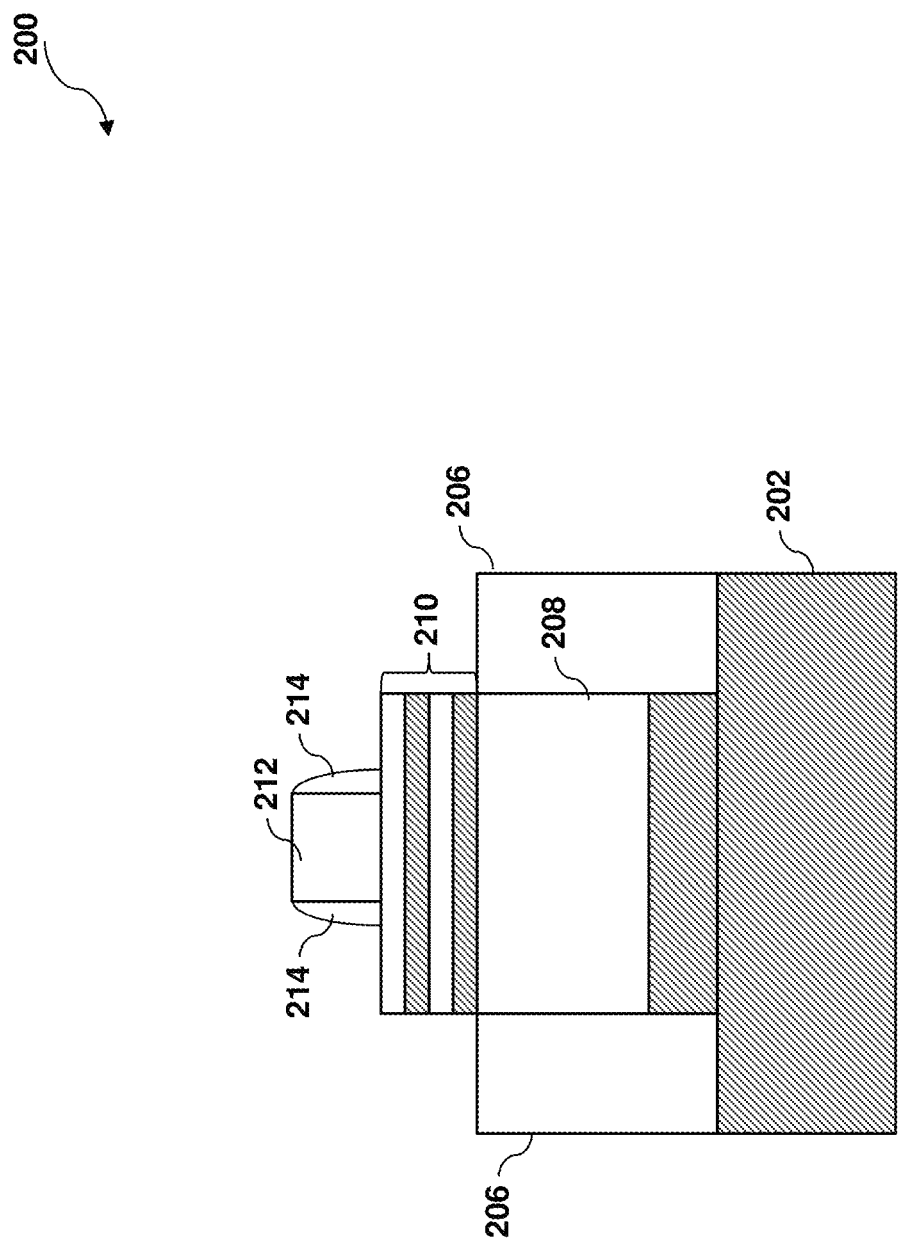

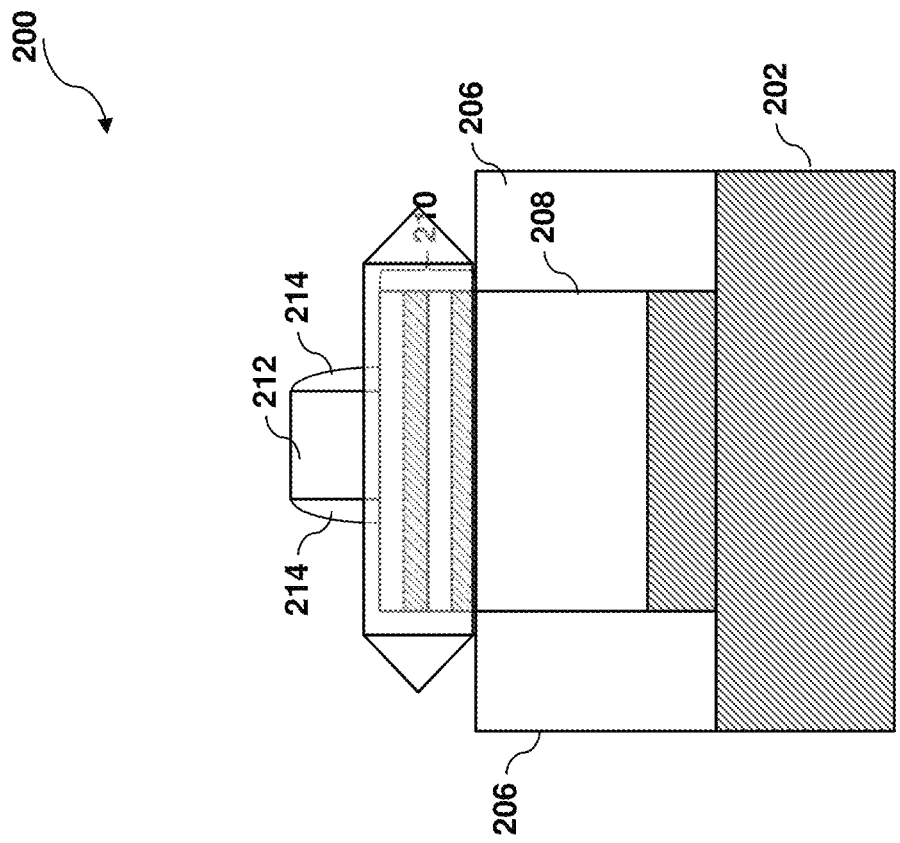
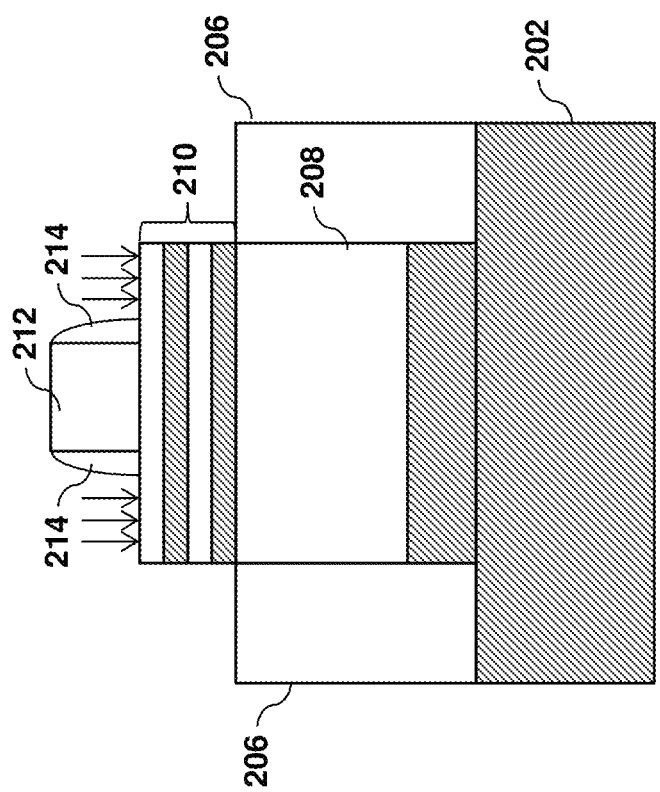

DEVICE WITH A STRAINED FIN

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

One development in the scaling down process is the use of fin field effect transistors (FinFETs). It is desired to further improve the operation of FinFETs, such as by using a strained channel. However, a strained channel for FinFET often faces challenges such as a stress relaxation of a channel between a source and a drain of the FinFET due to a finite length of the fin. The channel relaxation reduces channel stress and further reduces mobility of a charge moving in the channel. The low mobility of the charge moving in the channel further reduces a performance of the FinFET. Accordingly, what is needed is a device for improving operation of the FinFET.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIGS. 2-12 are cross sectional views of fabricating a device for benefiting from one or more embodiments of the present disclosure.

DETAILED DESCRIPTION

Figure 1:
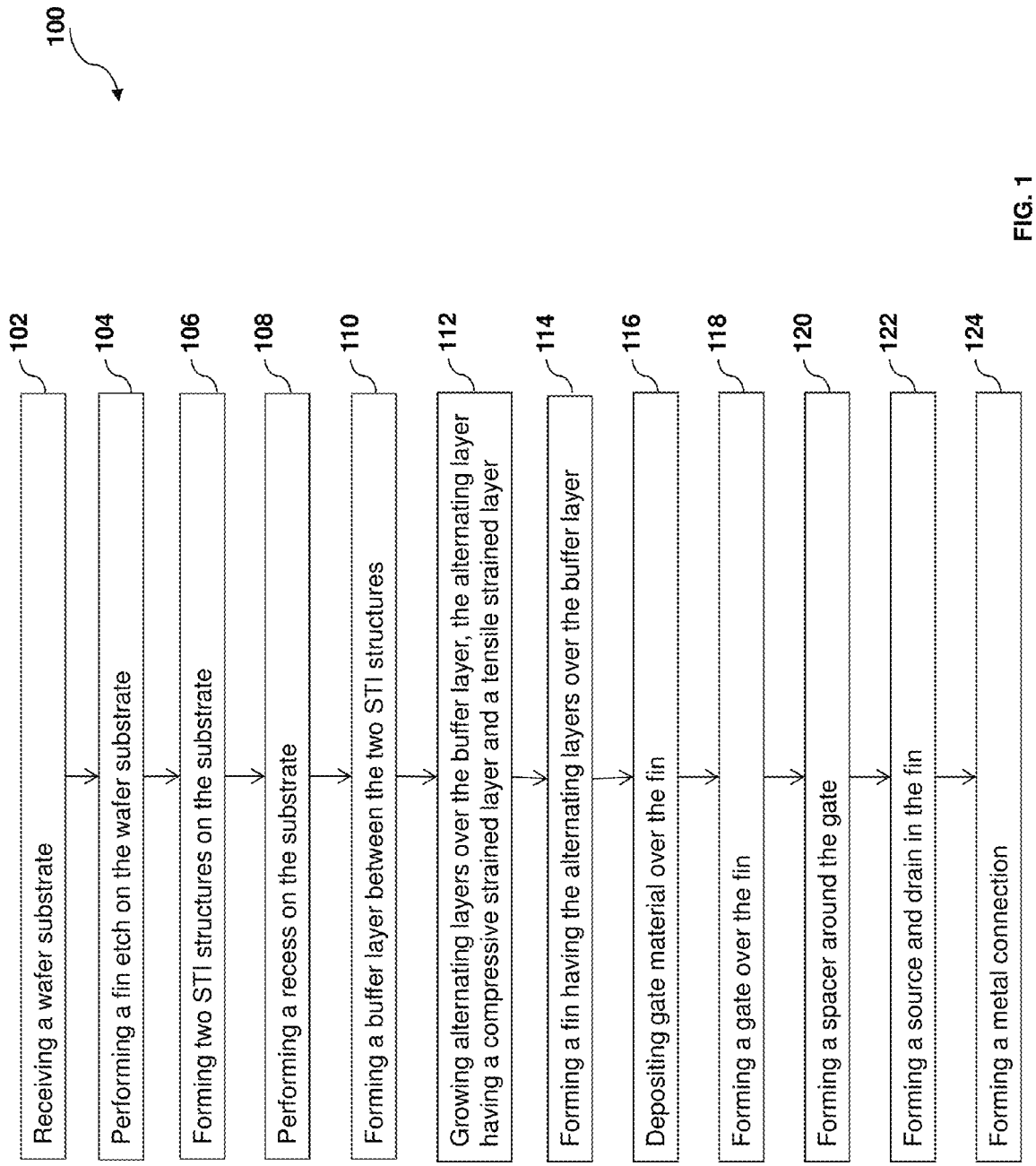
FIG. 1 is a flow chart of a method of fabricating a device for implementing one or more embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring now to FIG. 1, a flow chart of a method 100 of fabricating a device is illustrated according to one or more embodiments of the present disclosure. In embodiments, a device is also referred to as a structure or a cell. The method 100 begins at step 102 by receiving a substrate. In some embodiments, the substrate includes a wafer and/or a plurality of conductive and non-conductive thin films. The wafer may be a semiconductor substrate including silicon (in other words, a silicon wafer). Alternatively or additionally, the wafer may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. In an embodiment, the wafer is a semiconductor on insulator (SOI). The plurality of conductive and non-conductive thin films may comprise an insulator or a conductive material. For example, the conductive material comprises a metal such as aluminum (Al), copper (Cu), tungsten (W), nickel (Ni), titanium (Ti), gold (Au), and platinum (Pt) and, thereof an alloy of the metals. The insulator material may include silicon oxide and silicon nitride.

The method 100 proceeds to step 104 by forming a fin structure. The fin structure may be formed by performing a fin etch operation to form a fin structure in a wafer substrate. The fin structure is made of a wafer substrate material. Step 104 may include using a lithography process to form a resist pattern on the wafer substrate. Step 104 also includes etching the resist pattern formed on the wafer substrate using an etching process to form the fin structure. Step 104 may further include using a cleaning process. Referring to the example of FIG. 1, a fin structure 204 is disposed on a wafer substrate 202.

Figure 3:
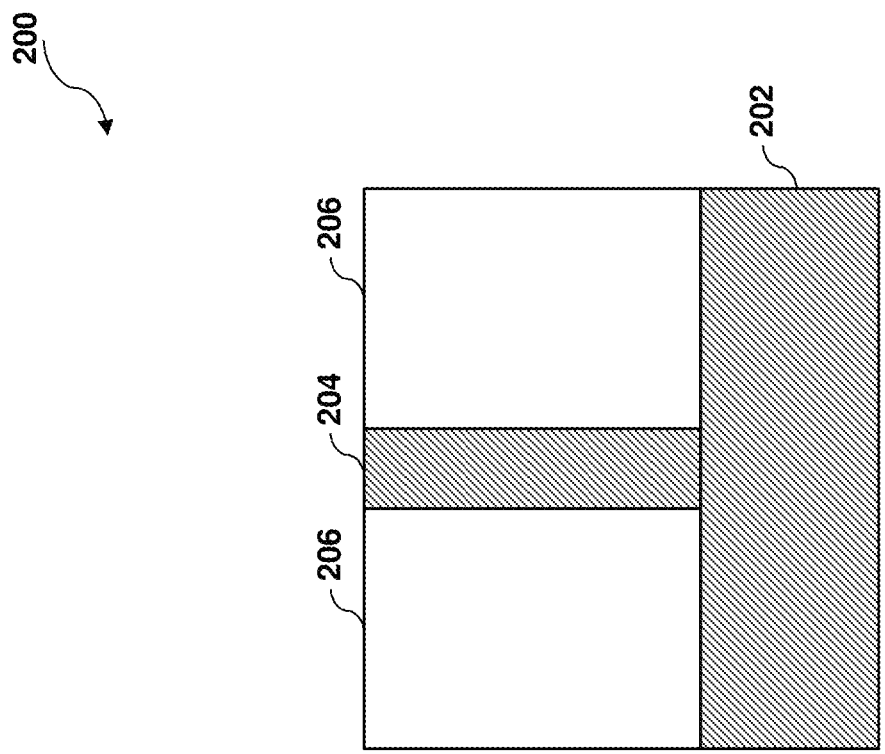
Figure 2:
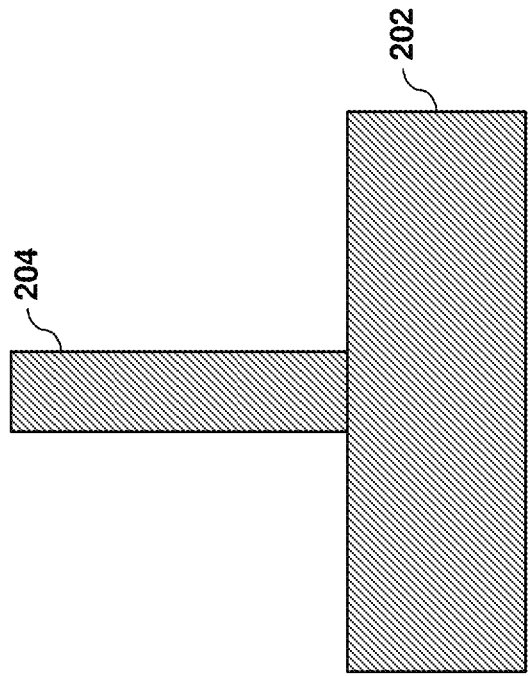

The method 100 proceeds to step 106 by forming a shallow trench isolation (STI) structure in the wafer substrate. The STI structure divides the wafer substrate in two areas, a negative charge metal oxide semiconductor (NMOS) area and a positive charge metal oxide semiconductor (PMOS) area. The STI structure includes a silicon oxide, a silicon nitride, silicon nitride oxide, or other alternative material. Step 104 includes using a deposition process. Step 104 may also include using a chemical mechanical polishing (CMP) process. Step 104 can further include using a cleaning process. Referring to the example of FIG. 3, two STI structures 206 are deposited on the wafer substrate 202 and separated by the fin structure 204.

Figure 4:
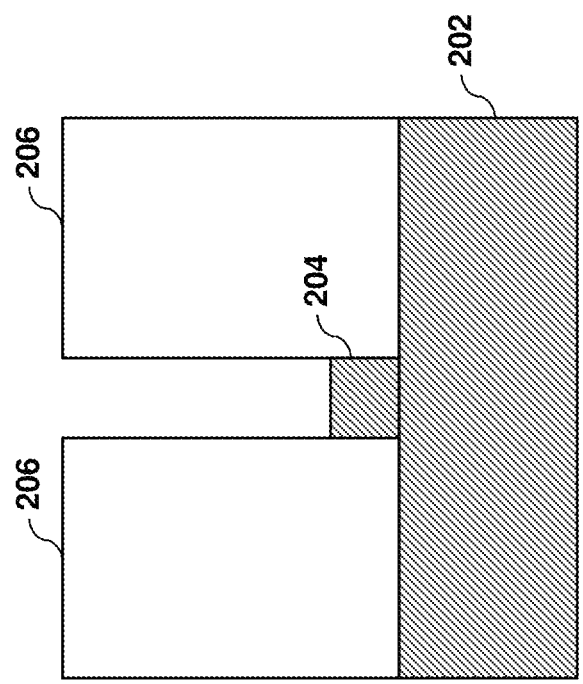

The method 100 proceeds to step 108 by forming a space of recess in the wafer substrate material. Step 108 may include performing a recess etching process on the wafer substrate to remove or partially remove the wafer substrate material between the two STI structures. Removing or partially removing the wafer substrate material between the two STI includes creating a space that may be filled with buffer material as discussed below. Step 108 may also include using a cleaning process. Referring to the example of FIG. 4, the fin structure 204 between the two STI structures 206 deposited on the wafer substrate 202 is partially removed forming a space or recess 203.

Figure 5:
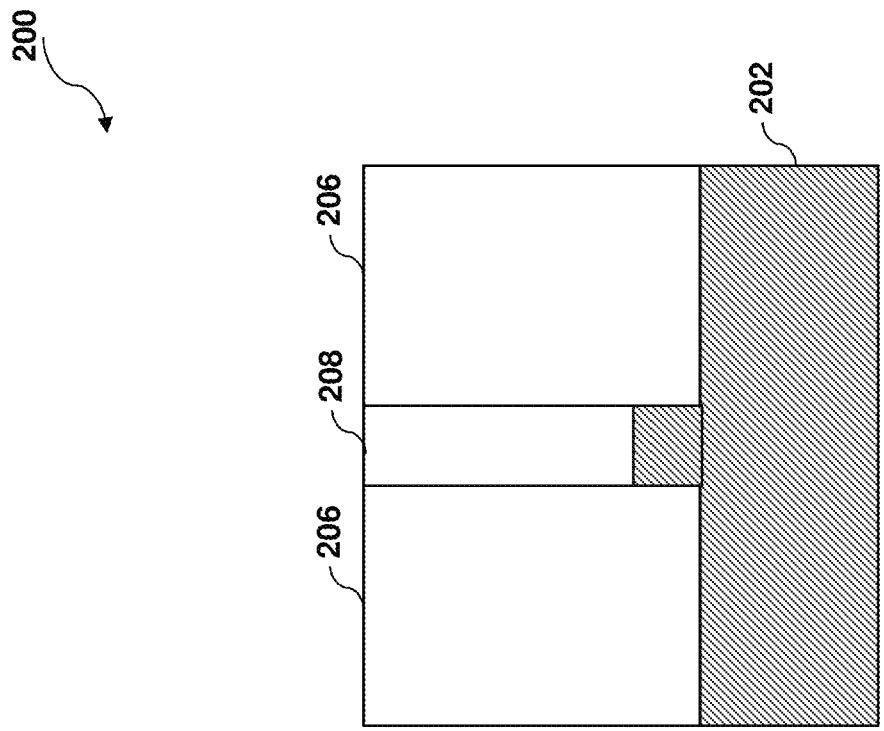

The method 100 proceeds to step 110 by growing buffer material or materials into the space. Thus, a buffer layer is formed between the STI structures. In an embodiment, the buffer layer includes an element in Group IV of an element table or combinations thereof, such as Si, Ge, or $Si_{1-x}Ge_x$. The buffer layer also includes a combination of elements in the Group III-V, such as InP, InAs or GaSb. The buffer layer has a first lattice constant. The lattice constant will be discussed in more detail below. Step 110 includes using a film growth process, such as epitaxial growth. Step 110 may also include using a CMP process. Step 110 may include using a well ion implantation and/or anneal process to form the buffer layer. Referring to the example of FIG. 5, a buffer layer 208 is disposed between the two STI structures 206 formed on the wafer substrate 202.

The method 100 proceeds to step 112 by growing at least one pair of alternating layers over the buffer layer between the STI structures. One pair of alternating layers includes a compressive strained layer and a tensile strained layer. In the present embodiments, a compressed strained layer is also referred to as a compressive layer and a tensile strained layer is referred to as a tensile layer. In some embodiments, the pair of alternating layers includes, as an average, a second lattice constant. The second lattice may be adapted to the first lattice constant of the buffer layer. For example, in an embodiment the at least one pair of alternating layers are selected (e.g., material, thickness, etc) such that their average lattice constant—referred to as the second lattice constant—is substantially equal to the lattice constant of the underlying buffer layer—referred to as the first lattice constant. A layer of the pair of alternating layers including a lattice constant larger than the lattice constant of the buffer layer is referred to as a compressive strained layer; and a layer of the pair of alternating layers including a lattice constant smaller than the lattice constant of the buffer layer is referred to as a tensile strained layer.

In some embodiments, the pair of alternating layers includes a combination of elements in the Group IV, such as SiC/SiGe, GeSn/SiGe, $Si_{1-y}Ge_y/Si_{1-z}Ge_z$. In other embodiments, the pair of alternating layers also includes a combination of elements in Group III-V, such as $In_{1-x}Al_xAs/In1_{-y}Ga_yAs$, $AlAs_{1-x}Sb_x/In_{1-y}Ga_yAs$, $AlAs_{1-x}Sb_x/GaAs_{1-y}Sb_y$, $AlAs_{1-x}Sb_x/In_yGa_{1-y}Sb$, $AlAs_{1-x}Sb_x/InAs_{1-y}Sb_y$, $In_xAl_{1-x}Sb/GaAs_{1-y}Sb_y$. A pair of alternating layers may include other materials. The composition of each of the layers in the pair of alternating layers may be selected such that the average lattice constant of the pair of alternating layers is substantially equal to that of the underlying buffer layer. The thickness of each of the layers in the pair of alternative layers may also be selected such that the average lattice constant of the pair of alternating layers is substantially equal to that of the underlying buffer layer. In an embodiment, each layer of the pair of layers has a substantially similar thickness. In another embodiment, each layer of the pair of layers has a different thickness.

Figure 6:
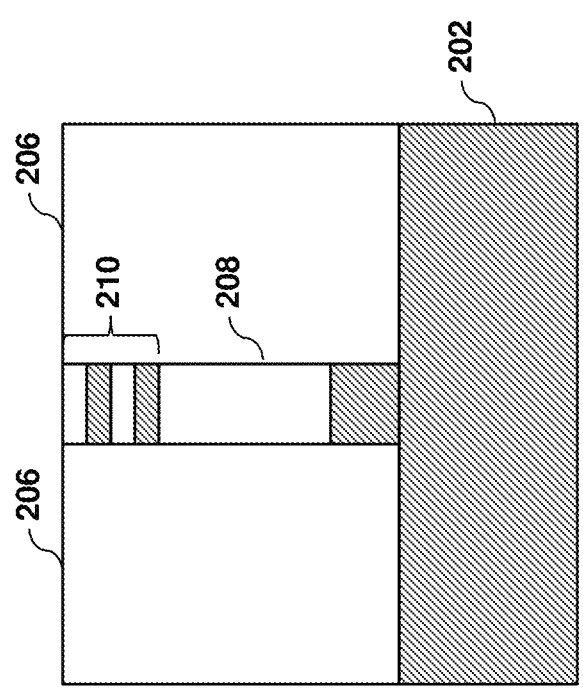

In an embodiment, step 112 includes growing one of a compressive layer or a tensile layer over a buffer layer and following by growing the other one of a tensile layer or a compressive layer on the first layer. This process may be repeated any number of times (e.g., any number of pairs of alternating layers may be grown on the buffer layer. Step 112 includes using a recess etching process prior to growing the pair of alternating layers. For example, the buffer layer may be etched such that a top surface of the buffer layer is recessed from a top surface of the STI structures. The pair(s) of alternating layers may be formed on the buffer layer in the recess. Step 112 may further include using a CMP process and a cleaning process. Referring to the example of FIG. 6, two pairs of alternating layers 210 are disposed on the buffer layer 208. Two pairs of alternative layers are provided for ease of illustration only and not intended to be limiting to any number of layers.

Figure 7:
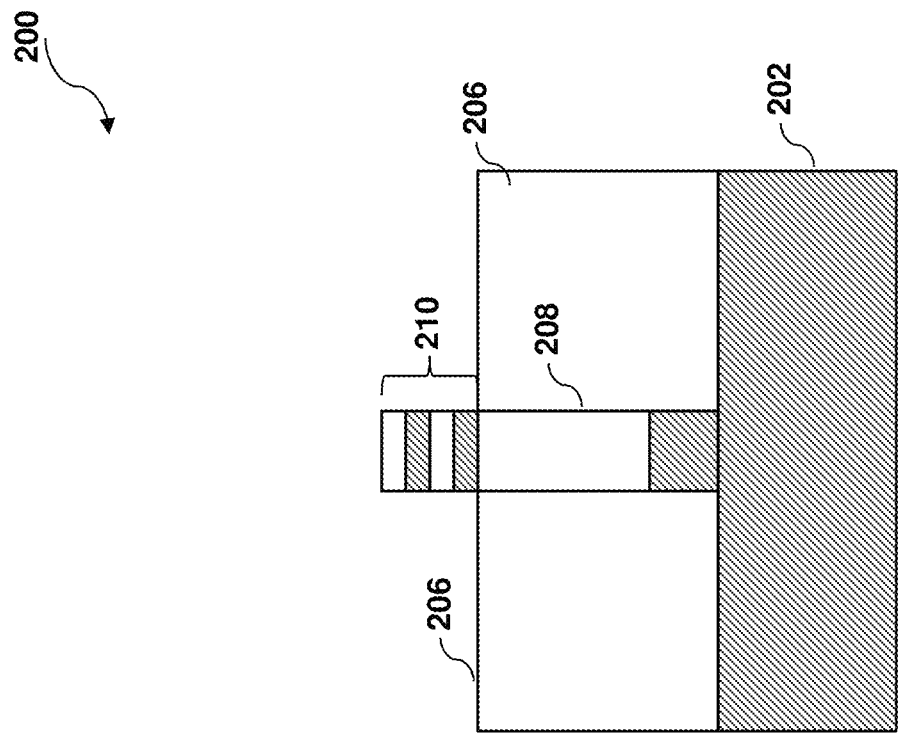

The method 100 proceeds to step 114 by forming a fin over a buffer layer embedded between two STI structures deposited on a wafer substrate. The fin includes multiple pairs of alternating layers. In an embodiment, step 114 includes using an etching process to recess the STI structures adjacent the pairs of alternating layers for example, such that the multiple pairs of alternative layers raise above a top surface of the STI structures providing a fin structure. Step 114 may also include using a cleaning process. Referring to the example of FIG. 7, the pairs of alternating layers 210 provide a fin structure 211 i disposed over the buffer layer 208 between two STI structure 206 deposited on the wafer substrate 202. The fin structure 211 may include any plurality of pairs of alternating layers.

The method 100 proceeds to step 116 by depositing a gate stack layer over a fin structure having one or more pairs of alternating layers and STI structure. The gate stack includes an interfacial layer deposited over the fin structure and the STI structure, and a gate layer deposited over the interfacial layer. In some embodiments, the interfacial layer includes a high-k dielectric layer, such as silicon oxide or silicon nitride, and the gate layer includes a polysilicon layer, a metal layer, or a combination thereof. Step 116 includes using a deposition process.

Figure 8:
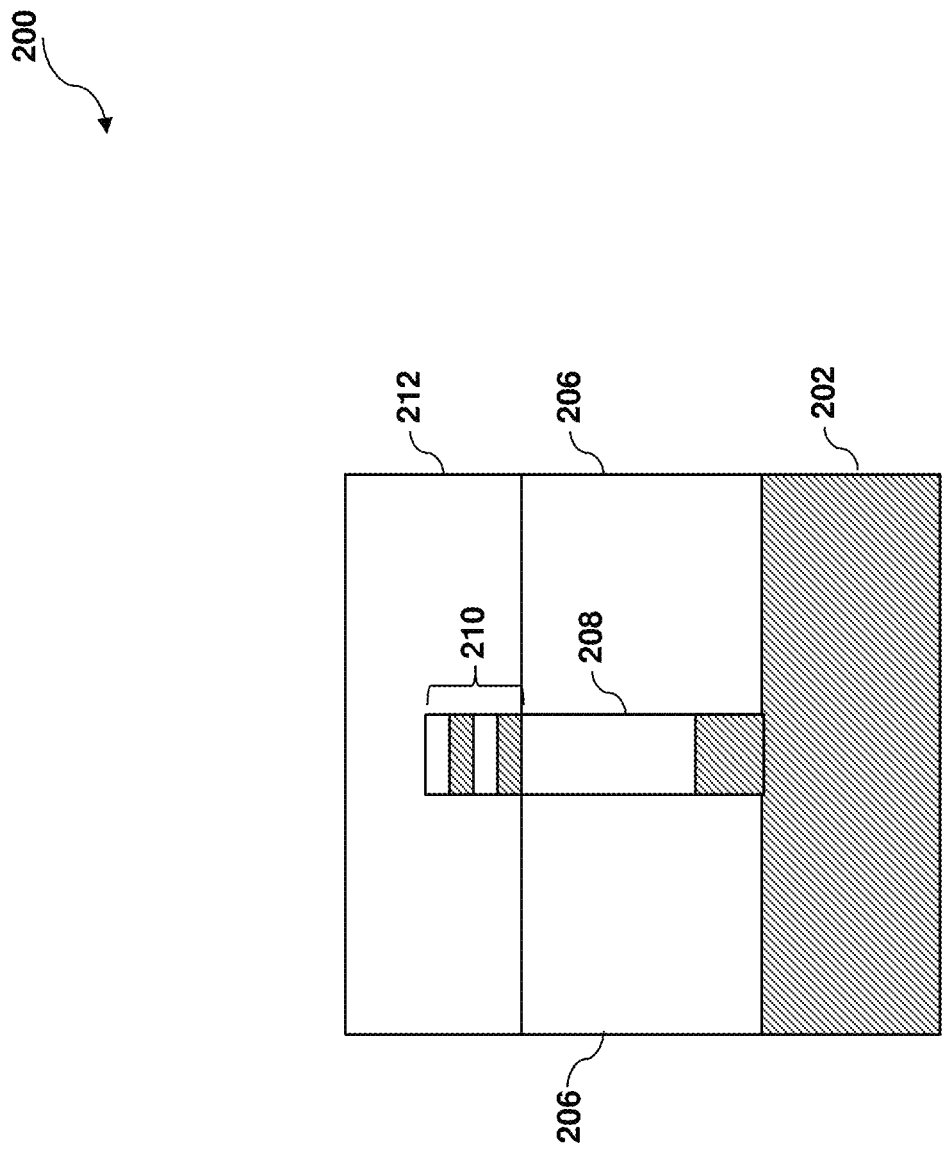

The method 100 proceeds to step 118 by forming a gate over the fin. The step includes an interfacial layer contacting the fin and a gate layer disposed over the interfacial layer, thereby forming a gate stack layer. Step 118 includes using a lithography process to form a resist pattern on the gate stack layer. Step 118 also includes etching the resist pattern formed on the gate stack layer using an etching process to form the gate. Step 118 further includes using a cleaning process. Referring to the examples of FIGS. 8-9, a gate 212 is formed over the fin 210 over the buffer layer 208 and the STI structure 206 over the wafer substrate 202.

The method 100 proceeds to step 120 by forming a spacer adjacent to the sides of the gate. The spacer provides a protection for the gate during a doping process. The spacer includes a silicon oxide or a silicon nitride. Other materials are possible. In one embodiment, step 120 includes depositing a spacer layer over a gate pattern using a deposition process. Step 120 may include using a lithography process. Step 120 also includes using an etching process. Referring to the example of FIG. 10, a spacer 214 is disposed adjacent sides of the gate 212 disposed over the fin 210 disposed over the buffer layer 208 and the wafer substrate 202.

The method 100 proceeds to step 122 by forming contacts. Forming the contacts includes forming a source/drain for a gate. Step 122 includes an ion implantation using a dopant, such as B, P, or As, followed by an anneal process. Step 122 also includes using an in-situ doped epitaxial process, such as SiGe doped with B, P or AS. Referring to the example of FIG. 11, an ion implantation is illustrated, and referring to the example of FIG. 12, an in-situ doped epitaxial process is illustrated.

The method 100 proceeds to step 124 by forming metal connections. Forming the metal connections includes forming a metal line or plug connecting to the gate, source, and drain, gate, as well as any capacitor, and/or resistor. Step 124 includes using a lithography process to form a resist pattern and etching the resist pattern using an etching process to form a material feature. Step 124 also includes using a deposition process to form a conducting layer or a dielectric layer. Step 124 further including using a CMP and a cleaning process. It is understood that additional steps can be provided before, during, and after the method 100, and some the steps described can be replaced, eliminated, or moved around for additional embodiments of the method 100. The method 100 is example embodiments, and is not intended to limit the present invention beyond what is explicitly recited in the claims In the foregoing discussion, by fabricating a device, various processes, such us a film deposition process, a lithography process, an etching process, an ion implantation process, a CMP process, and a cleaning process, are performed. In the present embodiments, the film deposition process includes depositing a physical vapor deposition (PVD) process such as evaporation and DC magnetron sputtering, a plating process such as electrode-less plating or electroplating, a chemical vapor deposition (CVD) process such as atmospheric pressure CVD (APCVD), a low pressure CVD (LPCVD), a plasma enhanced CVD (PECVD), or a high density plasma CVD (HDP CVD), an ion beam deposition, spin-on coating, a metal-organic decomposition (MOD), an atomic layer deposition (ALD) process and/or other suitable methods.

In some embodiments, the lithography process may include coating a resist film on a wafer substrate, exposing the resist film deposited on the wafer substrate by an optical lithography tool or a charged particle beam writer, and developing the exposed resist film to form a resist pattern for an ion implantation process or an etching process. The coating the resist film on the wafer substrate includes performing a dehydration process before applying the resist film on the wafer substrate, which can enhance an adhesion of the resist film to the wafer substrate. The dehydration process may include baking the substrate at a high temperature for a duration of time, or applying a chemical such as hexamethyldisilizane (HMDS) to the substrate. The coating the resist film on the wafer substrate may include a soft bake (SB). The exposing the resist film deposited on the wafer substrate includes using a mask. The mask may be a binary mask (BIM), a super binary mask (SBIM), or a phase shift mask (PSM), which includes an alternative phase shift mask (alt. PSM) or an attenuated phase shift mask (att. PSM). The optical lithography tool may include an I-line, a deep ultraviolet (DUV), or an extreme ultraviolet (EUV) tool. The charged particle beam writer includes an electron beam writer or a ion beam writer. The developing the exposed resist film may include a post exposure bake (PEB), a post develop bake (PDB) process, or a combination thereof.

The etching process may include a dry (plasma) etching, a wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Referring back to FIG. 9, a device 200 may benefit from one or more embodiments of the present invention. The device 200 includes the wafer substrate 202, at least two STI structures 206 disposed on the wafer substrate 202, the buffer layer 208 embedded between the two STI structures 206, the fin 210 disposed over the buffer layer 208, and the gate 212 disposed over the fin 210. In the present embodiments, the fin includes multiple alternating layers. It is understood that other configuration, inclusion, or omission of the device 200 may be possible. The device 200 is example embodiments, and is not intended to limit the present invention beyond what is explicitly recited in the claims.

In some embodiments, the wafer substrate 202 includes a wafer and/or a plurality of conductive and non-conductive thin films. The wafer is a semiconductor substrate including silicon (in other words, a silicon wafer). In yet another alternative, the wafer is a semiconductor on insulator (SOI).

The STI structure 206 is disposed on the wafer substrate 202. In the present embodiments, a STI structure is also referred to as an isolation structure or feature. The STI structure 206 divides the wafer substrate 202 in two areas, a negative charge metal oxide semiconductor (NMOS) area and a positive charge metal oxide semiconductor (PMOS) area. The STI structure 206 includes a silicon oxide, a silicon nitride, or a silicon nitride oxide. The STI structure may include other oxide materials.

Figure 9:
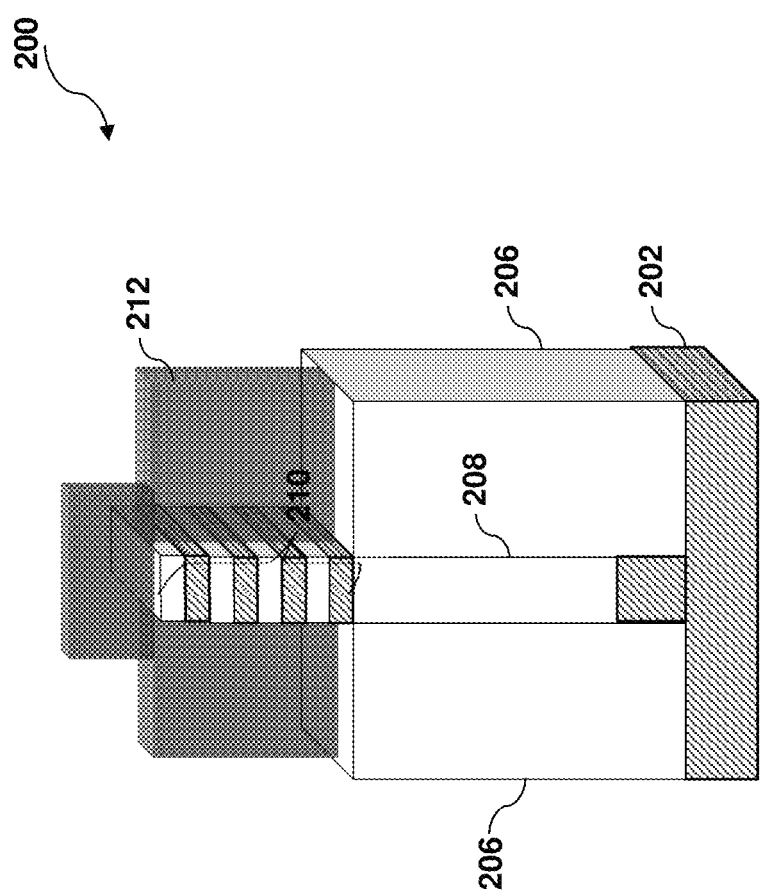

As shown in FIG. 9, the buffer layer 208 is embedded between the two STI structures 206. The buffer layer 208 includes a lattice structure, having a first lattice constant. In the present embodiments, a lattice constant is referred to as a distance between unit cells in a lattice structure. The buffer layer 208 includes an element in the Group IV or a combination thereof, such as Si, Ge, and $Si_{1-x}Ge_x$. The buffer layer 208 also includes a combination of elements in the Group III-V, such as InP, InAs, or GaSb. The buffer layer 208 may include other possible material.

The fin 210 is disposed over the buffer layer 208 embedded between two STI structures 206. The fin 210 includes at least one pair o of alternating layers. One pair of alternating layers includes a compressive strained layer and a tensile strained layer. The pair of alternating layers includes a pair of lattice structures, representing the compressive strained layer and the tensile strained layer respectively. In the present embodiments, a layer in a fin or alternating layers disposed over a buffer layer with a lattice constant larger than the lattice constant of the buffer layer is referred to as a compressive strained layer, a layer in a fin or alternating layers disposed over the buffer layer with a lattice constant smaller than the lattice constant of the buffer layer is referred to as a tensile stained layer, and the pair of alternating layers provides an average lattice constant or a second lattice constant. One pair of alternating layers includes a combination of elements in the Group III-V, such as SiC/SiGe, GeSn/SiGe, $Si_{1-y}Ge_y/Si_{1-z}Ge_z$, $In_{1-x}Al_xAs/In1-_yGa_yAs$, $AlAs_{1-x}Sb_x/In_{1-y}Ga_yAs$, $AlAs_{1-x}Sb_x/GaAs_{1-y}Sb_y$, $AlAs_{1-x}Sb_x/In_yGa_{1-y}Sb$, $AlAs_{1-x}Sb_x/InAs_{1-y}Sb_y$, and $In_yAl_{1-x}Sb/GaAs_{1-y}Sb_y$. The fin 210 may include other possible material.

In the present embodiments, a compressive strained layer or a tensile strained layer is fully strained if a thickness of a compressive strained layer or a tensile strained layer is below an epitaxial critical thickness for each strained layer and a thickness and composition of a compressive strained layer or a tensile strained layer are chosen such that an average lattice constant or second lattice constant of multiple alternating layers is equal to a first lattice constant of an underlying buffer layer. According to one or more embodiments, a compressive strained layer and a tensile strained layer of a pair of alternating layers in a fin remain strained within a fin and even at a fin edge.

For example, an element in the Group IV or combination thereof can be used as a buffer and multiple alternating layers, such as Si buffer plus SiC/SiGe alternating layers for PMOS and/or NMOS, Ge buffer plus GeSn/SiGe alternating layers for PMOS and/or NMOS, and $Si_{1-x}Ge_x$ plus $Si_{1-y}Ge_y/Si_{1-z}Ge_z$, for PMOS and/or NMOS. In other example, numerous combination of elements in the Group III-V can be used as a buffer and multiple alternating layers, such as InP buffer plus $In_{1-x}Al_xAs/In1-_yGa_yAs$ alternating layers, InP buffer plus $AlAs_{1-x}Sb_x/In_{1-y}Ga_yAs$ alternative layers, InP buffer plus $AlAs_{1-x}Sb_x/GaAs_{1-y}Sb_y$ alternating layers, InAs or GaSb buffer plus $AlAs_{1-x}Sb_x/In_yGa_{1-y}Sb$ alternating layers, InAs or GaSb buffer plus $AlAs_{1-x}Sb_x/InAs_{1-y}Sb_y$ alternative layers, and InAS or GaSb buffer plus and $In_xAl_{1-x}Sb/GaAs_{1-y}Sb_y$ alternating layers. Other material as buffer and alternating layers are possible.

Figure 13:
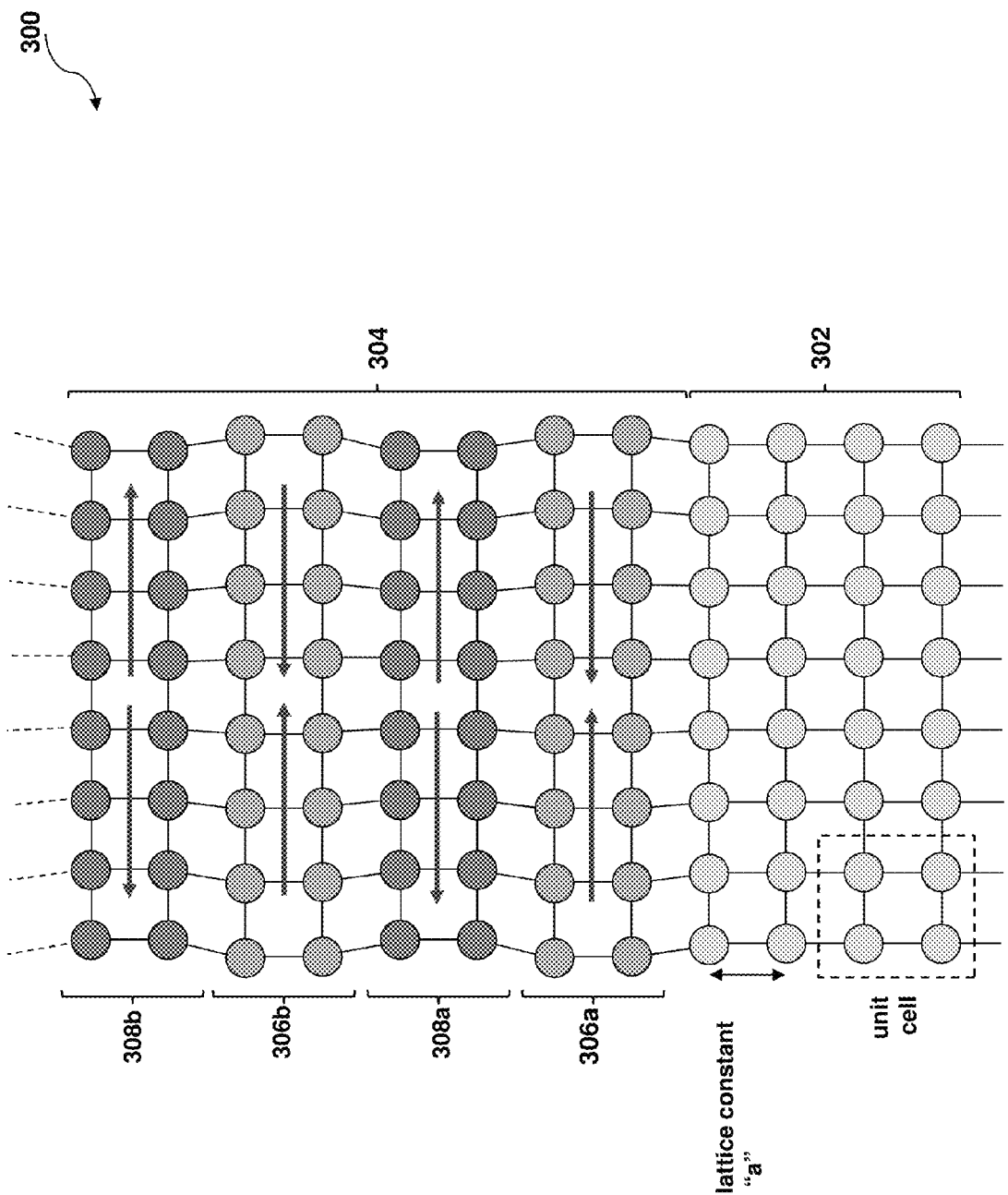
FIG. 13 is an example of a lattice structure according to one or more embodiments of the present disclosure.

Referring to FIG. 13, an example of a lattice structure 300 is illustrated according to one or more embodiments. In one embodiment, a multiple alternating layers 304 are formed on a buffer layer 302 and the multiple alternative layers 304 include a compressive layer 306 and a tensile layer 308. Also in the embodiment, a first compressive layer 306a is formed on a buffer layer 302, a first tensile layer 308a is formed on the first compressive layer 306b, a second compressive layer 306b is formed on the first tensile stress layer 308a, and a second tensile layer 308b is formed on the second compressive layer 306b. Thicknesses and compositions of the compressive layer 306 and the tensile layer 308 are chosen such that an average lattice constant of the multiple alternative layers 304 is equal to a lattice constant of the underlying buffer layer 302 and the compressive layer 306 and tensile layer 308 are full strained.

Figure 14:
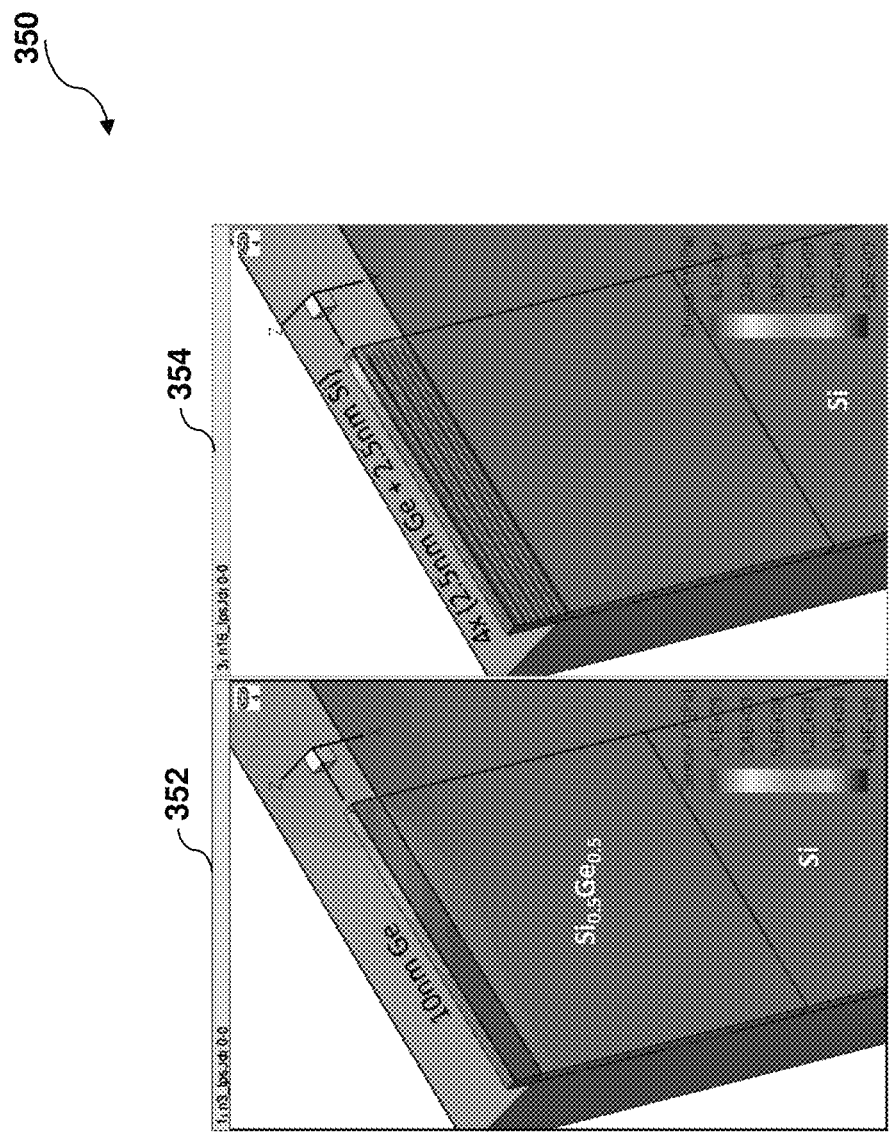
FIG. 14 is an example of a stress simulation on a fin according to one or more embodiments of the present disclosure.

For example, if a buffer layer includes $Si_{0.5}Ge_{0.5}$ and has a lattice constant (first lattice constant) $\alpha$, a fin including multiple alternating layers disposed over the buffer layer include four compressive Ge layers with 2.5 nm thickness for each compressive layer and four tensile Si layers with 2.5 nm thickness for each tensile layer. A average lattice constant (second lattice constant) of the multiple alternating layers is equal to the lattice constant $\alpha$. The strained multiple alternating layers are full strained even near an edge of the multiple alternating layers. With referring to the example of FIG. 14, a stress simulation 352 and a stress simulation 354 are presented. The stress simulation 352 is performed on a full strain channel (FSC) fin and show relaxation at end of the FSC fin. The stress simulation 354 is performed on a fin including multiple alternating layers and shows that all multiple alternating layers are full stained and no relaxation is observed at edge of the fin. The stress simulation 354 also shows no limitation in numbers of the multiple alternating layers so that no limitation to height of a multiple alternating layers fin.

Referring back to FIG. 9, the gate 212 is disposed over the multiple alternating layers 210. The gate 212 includes an interfacial layer contacting the multiple alternating layers. The gate 212 also includes a polysilicon or a metal gate over the interfacial layer. The gate 212 may also include a spacer around side wall of the polysilicon gate or the metal gate.

Thus, the present disclosure describes a device. The device includes a wafer substrate including at least two isolation features, a buffer layer embedded between the two isolation features, wherein the buffer layer includes a first lattice constant, and a fin disposed over the buffer layer, wherein the fin includes at least one pair of alternating layers including a compressive strained layer and a tensile strained layer such that the pair of alternating layers has a second lattice constant matching to the first lattice constant and remains strained at edge of the fin. The device further includes a gate disposed over the fin. The buffer layer includes element in Group III-V, or combination thereof. The second lattice constant is equal to the first lattices constant. The compressive strained layer includes an element in Group III-V, or combination thereof. A thickness of the compressive strained layer is a function of the first lattice constant. The tensile strained layer includes an element in Group III-V, or combination thereof. A thickness of the tensile strained layer is a function of the first lattice constant. The fin includes a source and a drain.

In some embodiment, a device is described. The device includes a wafer substrate including at least two isolation features, a buffer layer disposed between the two isolation features, wherein the buffer layer includes a first lattice constant, a fin having at least one pair of alternating layers disposed over the buffer, wherein the pair of alternating layers having a compressive layer and a tensile layer includes a second lattice constant so that the second lattice constant is equal to the fist lattice constant of the buffer layer. The device further includes a gate disposed over the fin, wherein the gate includes a spacer disposed adjacent side of the gate. Each the buffer and the fin include an element in Group III-V, or combination thereof. The fin includes a source and a drain of a PMOS. The fin includes a source and a drain of a NMOS.

The present disclosure also describes a method of fabricating a device. The method includes receiving a wafer substrate, forming at least two isolation features in the substrate, forming a buffer layer between the two isolation features, wherein the buffer layer includes a first lattice constant, and forming a fin over the buffer layer, wherein forming the fin includes depositing at least one pair of alternating layers over the buffer layer so that a second lattice constant of the pair of alternating layers matches the first lattice constant. The method further includes forming a gate over the fin. Depositing one pair of alternating layers includes depositing a compressive strained layer and a tensile strained layer. Forming a fin includes forming a source and a drain in the fin. Forming a buffer layer included using an element in Group III-V or combination thereof. Forming a fin including using an element in Group III-V of element table, or combination thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, the device comprising:
a wafer substrate including at least two isolation features;
a fin structure formed of the wafer substrate that is laterally adjacent to the two isolation features;
a buffer layer embedded between the two isolation features, wherein the buffer layer includes a first lattice constant; and
a fin disposed over the buffer layer, wherein the fin includes at least one pair of alternating layers having a compressive strained layer and a tensile strained layer such that the pair of alternating layers has a second lattice constant matching to the first lattice constant.

2. The device of claim 1, further comprising a gate disposed over the fin.

3. The device of claim 1, wherein the buffer layer includes an element in Group III-V.

4. The device of claim 1, wherein the second lattice constant is equal to the first lattices constant.

5. The device of claim 1, wherein the compressive strained layer includes an element in Group III-V, or combination thereof.

6. The device of claim 1, wherein a thickness of the compressive strained layer is selected so that an average lattice constant of the pair of alternating layers is substantially equal to the first lattice constant.

7. The device of claim 1, wherein the tensile strained layer includes an element in Group III-V, or combination thereof.

8. The device of claim 1, wherein a thickness of the tensile strained layer is selected so that an average lattice constant of the pair of alternating layers is substantially equal to the first lattice constant.

9. The device of claim 1, wherein the fin includes a source and a drain.

10. A semiconductor device, the device comprising:
   a wafer substrate including at least two isolation features;
   a fin structure formed of the wafer substrate that is laterally adjacent to the two isolation features;
   a buffer layer disposed between the two isolation features, wherein the buffer layer includes a lattice structure with a first lattice constant; and
   a fin disposed over the buffer layer, wherein the fin includes at least one pair of alternating layers having a compressive strained layer and a tensile strained layer such that the pair of alternating layers has a second lattice constant equal to the first lattice constant.

11. The device of claim 10, further comprising a gate disposed over the fin, wherein the gate electron includes a spacer disposed adjacent side of the gate.

12. The device of claim 10, wherein each of the buffer layer and the fin include an element in Group III-V.

13. The device of claim 10, wherein the fin includes a source and a drain of a PMOS.

14. The device of claim 10, wherein the fin includes a source and a drain of a NMOS.

15. A method of forming a semiconductor device, the method comprising:
   receiving a wafer substrate;
   forming at least two isolation features in the substrate;
   forming a fin structure formed of the wafer substrate laterally adjacent to the two isolation features;
   forming a buffer layer between the two isolation features, wherein the buffer layer includes a first lattice constant; and
   forming a fin over the buffer layer, wherein forming the fin includes depositing at least one pair of alternating layers over the buffer layer so that a second lattice constant of the pair of alternating layers matches the first lattice constant of the buffer layer.

16. The method of claim 15, further comprising forming a gate over the fin.

17. The method of claim 15, wherein depositing one pair of alternating layers includes depositing a compressive strained layer and a tensile strained layer.

18. The method of claim 15, forming a fin includes forming a source and a drain in the fin.

19. The method of claim 15, forming a buffer layer included using an element in Group III-V.

20. The method of claim 15, forming a fin including using an element in Group III-V of element table, or combination thereof.

* * * * *